United States Patent
Kohlberger

(10) Patent No.: US 9,847,560 B2
(45) Date of Patent: Dec. 19, 2017

(54) ELECTROCHEMICAL ENERGY CELL, AND RECHARGEABLE BATTERY FOR REPEATEDLY STORING ELECTRICAL ENERGY, AND ALSO METHOD FOR DETERMINING AN ELECTRODE POTENTIAL OF AN ELECTRODE OF AN ELECTROCHEMICAL ENERGY STORAGE CELL

(71) Applicants: Robert Bosch GmbH, Stuttgart (DE); Samsung SDI Co., Ltd., Yongin-si, Gyeonggi-do (KR)

(72) Inventor: Markus Kohlberger, Stuttgart (DE)

(73) Assignees: Robert Bosch GmbH, Stuttgart (DE); Samsung SDI Co., Ltd., Yongin-si, Gyeonggi-do (KR)

(*) Notice: Subject to any disclaimer, the term of this patent is extended or adjusted under 35 U.S.C. 154(b) by 130 days.

(21) Appl. No.: 14/683,254

(22) Filed: Apr. 10, 2015

(65) Prior Publication Data
US 2015/0295284 A1   Oct. 15, 2015

(30) Foreign Application Priority Data
Apr. 11, 2014   (DE) .................. 10 2014 206 990

(51) Int. Cl.
| H01M 10/44 | (2006.01) |
| H01M 10/48 | (2006.01) |
| H01G 9/02 | (2006.01) |
| H01M 10/04 | (2006.01) |
| G01R 31/36 | (2006.01) |
| H01M 10/0587 | (2010.01) |

(52) U.S. Cl.
CPC ........ *H01M 10/48* (2013.01); *G01R 31/3627* (2013.01); *H01M 10/0431* (2013.01); *H01M 10/0587* (2013.01)

(58) Field of Classification Search
CPC .............. H01M 10/48; H01M 10/0431; G01R 31/3627
USPC ............. 320/101; 324/426; 429/91; 361/505
See application file for complete search history.

(56) References Cited

U.S. PATENT DOCUMENTS

| 4,346,153 A * | 8/1982 | Rigal ...................... H01M 4/73 429/234 |
| 6,728,129 B2 * | 4/2004 | Lindsey ................. B82Y 10/00 365/151 |
| 6,921,475 B2 * | 7/2005 | Kuhr ..................... B82Y 10/00 204/400 |

(Continued)

FOREIGN PATENT DOCUMENTS

| CN | 101855773 A | 10/2010 |
| DE | 10 2011 015 792 A1 | 12/2011 |

*Primary Examiner* — M'Baye Diao
(74) *Attorney, Agent, or Firm* — Maginot, Moore & Beck LLP

(57) ABSTRACT

An electrochemical energy storage cell is configured to repeatedly store electrical energy, and includes two electrodes, and at least one reference electrode element to enable determining an electrode potential of at least one of the two electrodes. A rechargeable battery, and in particular to a rechargeable lithium-ion battery, includes the electrochemical energy storage cell, and is configured to supply electrical energy to an electrical load. A method includes determining an electrode potential of at least one of the two electrodes with reference to the at least one reference electrode element.

6 Claims, 4 Drawing Sheets

(56) References Cited

U.S. PATENT DOCUMENTS

| | | | |
|---|---|---|---|
| 8,313,866 B2* | 11/2012 | Ofer | H01M 10/052 |
| | | | 429/231.3 |
| 8,760,118 B2* | 6/2014 | Christensen | H01M 10/052 |
| | | | 320/121 |
| 8,816,635 B2* | 8/2014 | Yerramalli | H01M 2/34 |
| | | | 320/107 |
| 9,007,742 B2* | 4/2015 | Risser | H01G 11/46 |
| | | | 29/25.03 |
| 2009/0104510 A1 | 4/2009 | Fulop et al. | |
| 2009/0246626 A1* | 10/2009 | Tasaki | H01G 11/86 |
| | | | 429/208 |
| 2013/0002260 A1* | 1/2013 | Golubkov | H01M 10/4257 |
| | | | 324/426 |
| 2013/0009604 A1 | 1/2013 | Bhardwaj et al. | |
| 2013/0314051 A1 | 11/2013 | Takezawa | |

* cited by examiner

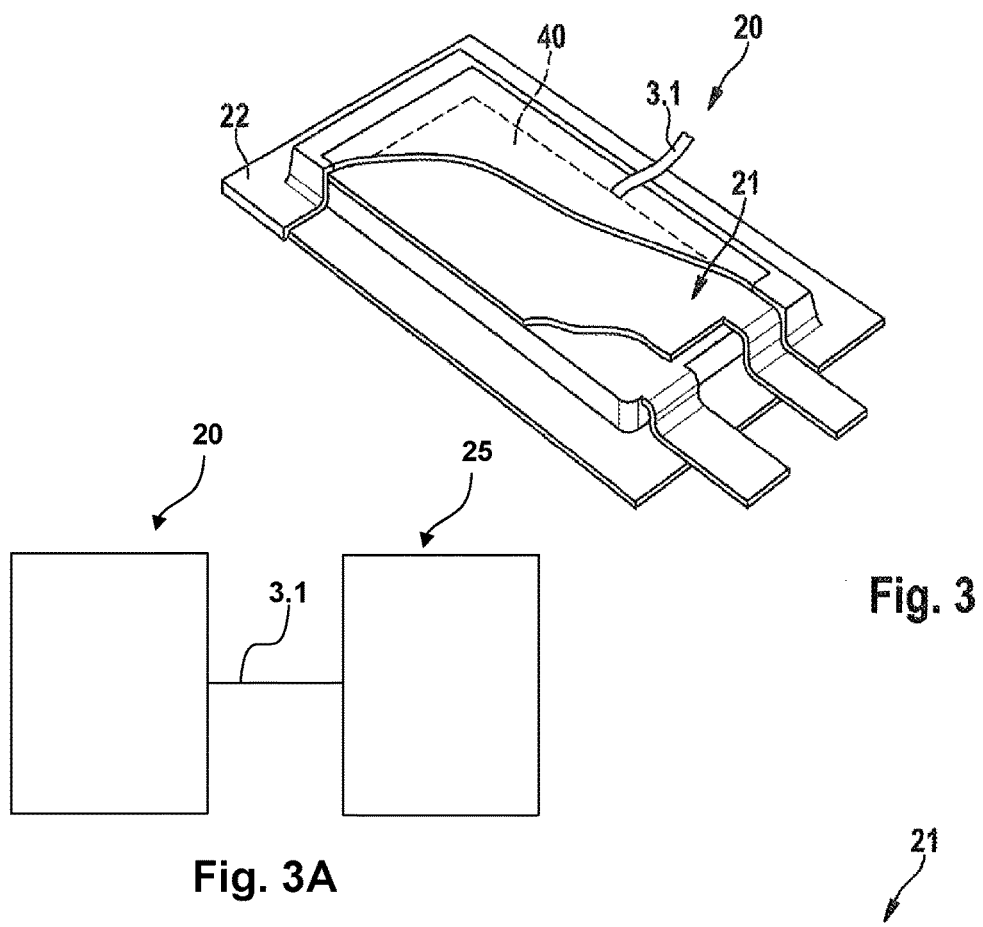
Fig. 3
Fig. 3A
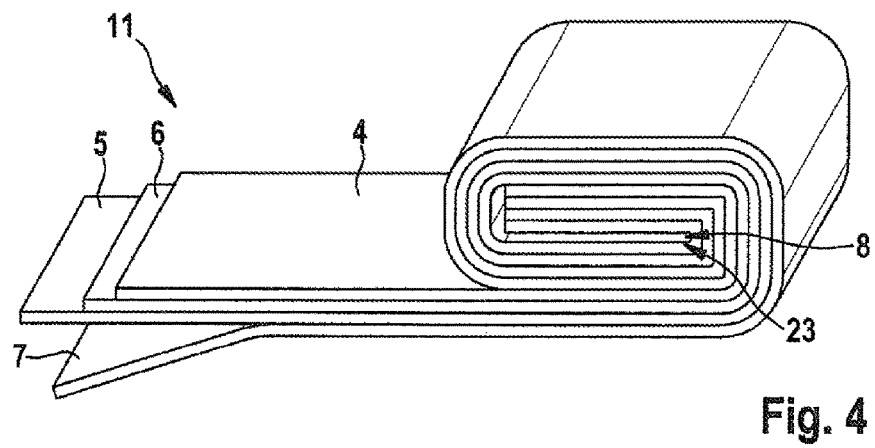
Fig. 4

ELECTROCHEMICAL ENERGY CELL, AND RECHARGEABLE BATTERY FOR REPEATEDLY STORING ELECTRICAL ENERGY, AND ALSO METHOD FOR DETERMINING AN ELECTRODE POTENTIAL OF AN ELECTRODE OF AN ELECTROCHEMICAL ENERGY STORAGE CELL

This application claims priority under 35 U.S.C. §119 to patent application no. DE 10 2014 206 990.4, filed on Apr. 11, 2014 in Germany, the disclosure of which is incorporated herein by reference in its entirety.

The present disclosure relates to an electrochemical energy storage cell for repeatedly storing electrical energy, and also to a rechargeable battery and, in particular, to a rechargeable lithium-ion battery for supplying electrical energy to an electrical load. The disclosure further relates to a method for determining an electrode potential of an electrode of an electrochemical energy storage cell.

BACKGROUND

It is known in principle that rechargeable cells and, in particular, electrochemical energy storage cells, such as rechargeable batteries for example, comprise two electrodes, and in particular one positive electrode or positively charged electrode, such as the anode for example, and one negative electrode or negatively charged electrode, such as the cathode for example, a chemical reaction taking place between said electrodes. Electrical energy is released on the basis of this chemical reaction. In the case of a rechargeable nickel-cadmium battery for example, the positive electrode comprises nickel compounds, such as nickel hydroxides for example, while the negative electrode comprises, for example, cadmium. Accordingly, the negative electrode of a rechargeable nickel-hydride battery comprises, for example, a hydrogen-storing metal alloy. As is known in principle, rechargeable lithium-ion batteries in particular are used very frequently, wherein the positive electrode of said rechargeable lithium-ion batteries comprises a lithium metal oxide, while the negative electrode advantageously comprises special carbons which can incorporate lithium ions. It is furthermore considered to be known in principle that the individual electrodes are spaced apart and, in particular, insulated from one another by means of a separator, in order to prevent an internal short circuit and consequently to prevent the electrical energy being lost in the form of heat. Furthermore, an electrolyte is required in particular, in order to allow an electrochemical reaction to take place, wherein the electrolyte itself can be, for example, a liquid which contains conductive salts. The electrolyte itself is located, for example, in the electrodes and the separator, wherein, in the case of rechargeable nickel batteries, potassium hydroxide solution or, in the case of rechargeable lithium-ion batteries, lithium salts which are dissolved in special organic solvents are used in particular. In addition to an electrode winding, the electrochemical energy storage cell can also have a housing which comprises, for example, a cell vessel and a cell cover. Therefore, it is to be considered to be known in principle that a cell vessel of a housing of this type can also serve, for example, as a negative outgoing conductor, that is to say the negative pole, while the cell cover can be used as the positive outgoing conductor, that is to say the positive pole, for example. Rechargeable cells can be designed in the form of winding cells in which at least the positive electrode, the separator and the negative electrode are placed one above the other and wound up, for example in the form of a strip-like sandwich, in such a way that the electrode forms a surface which is as large as possible, this, in turn, being advantageous in respect of short charging times and a high level of performance of the rechargeable battery.

One indicator of the state of a battery and, in particular, of a rechargeable battery which has at least one electrochemical energy storage cell and advantageously a plurality of electrochemical energy storage cells and which can be used multiple times both in stationary applications, such as in wind power plants for example, or in vehicles, such as in hybrid or electric vehicles for example, and also in the consumer sector, such as in laptops or mobile telephones for example, is the state of charge. Said state of charge is of particular importance since very stringent requirements are imposed on the battery systems or rechargeable battery systems used in respect of the reliability, performance and service life of said battery systems or rechargeable battery systems. The state of charge of an electrochemical energy storage cell and, in particular, of a galvanic cell of the rechargeable battery, which is also called the SOC, is determined by means of a cell voltage to the extent that it is known in principle. This means that, in particular, the open circuit voltage (OCV) is measured in the inoperative state. However, in this case, only the external cell voltage is recorded, and therefore only the total voltage of the cell, and in particular of the energy storage cell, can consequently disadvantageously be measured, but the potentials of the individual electrodes of the cell, and in particular of the energy storage cell, cannot be determined.

SUMMARY

The object of the present disclosure is therefore to at least partially overcome the above-described disadvantages in an electrochemical energy storage cell, and in particular a rechargeable battery, such as a rechargeable lithium-ion battery for example. The object of the present disclosure is, in particular, to provide an electrochemical energy storage cell for repeatedly storing electrical energy, and also a rechargeable battery, and in particular a rechargeable lithium-ion battery, and also a method for determining an electrode potential of an electrode of an electrochemical energy storage cell, by means of which determination of the potentials of individual electrodes of an electrochemical energy storage cell, and in particular of a rechargeable battery, having at least one electrochemical energy storage cell can be determined in a simple and cost-effective manner, wherein the use and, in particular, the performance and service life of the rechargeable battery and, in particular, of the electrochemical energy storage cell are not negatively influenced, even during the process of determining the electrode potential.

The above object is achieved by an electrochemical energy storage cell for repeatedly storing electrical energy, and also by a rechargeable battery, and in particular a rechargeable lithium-ion battery, for supplying electrical energy to an electrical load having the features. The above object is further achieved by a method for determining an electrode potential of an electrode of an electrochemical energy storage cell. Further features and details of the disclosure can be gathered from the claims, the description and the drawings. It goes without saying that features and details which are described in connection with the electrochemical energy storage cell also apply in connection with the rechargeable battery according to the disclosure and/or the method according to the disclosure and vice versa in each case, and therefore reference is always made or can always be made reciprocally with regard to the disclosure in respect of the individual aspects of the disclosure. The method according to the disclosure can also be carried out with the electrochemical energy storage cell according to the disclosure.

The electrochemical energy storage cell for repeatedly storing electrical energy, having a cell core and an electrode winding, having at least one winding, which is fitted around the cell core and comprises at least two electrodes and also at least one separator which is arranged between these electrodes, has at least one reference electrode element for determining an electrode potential of at least one electrode of the two electrodes. The electrochemical energy storage cell, which can also be called a galvanic cell and may be in the form of a flat cell or round cell, advantageously has at least a housing and an electrode winding which is arranged within the housing and which is wound around a cell core.

The electrode winding, winding for short, advantageously has a plurality of electrode layers of a winding tape, wherein the negative electrode, such as the cathode for example, and the positive electrode, such as the anode for example, with a separator situated between them, are wound up around the cell core. Depending on the design of the electrochemical energy storage cell, the electrode winding is also correspondingly designed and consequently has a flat or prismatic and advantageously rectangular or else a round and, in particular, a cylindrical or circular-cylindrical shape. The electrodes and/or the separator are advantageously flat and, in particular, in the form of a film in order to consequently be connected to one another in the form of an electrode winding. The separator, which serves to electrically insulate and therefore DC isolate the electrodes from one another, can advantageously comprise an electrolyte or consist of a corresponding electrolyte. It is further feasible for a further separator and likewise a further film-type separator to be arranged around the cell core in addition to the separator which is arranged between the electrodes, in order to establish DC isolation between at least one of the electrodes and the cell core.

The electrochemical energy storage cell, which advantageously operates in a gas-tight manner and which has an electrode winding, additionally has a reference electrode element for determining an electrode potential of at least one of the electrodes, such as, in particular, the positive electrode or the negative electrode. The reference electrode element, which can also be called a reference electrode, is consequently a reference electrode or a comparison electrode with an advantageously constant equilibrium potential which can be adjusted in a reproducible manner. The reference electrode element advantageously serves as a reference element for a measurement of the relative potential of one of the electrodes, wherein the absolute potential of one of the electrodes cannot be determined experimentally in principle, but rather can be defined only by means of the potential difference between two electrodes. In order to determine the individual electrode potential, the difference between the potential of the cathode and the potential of the reference electrode or the difference between the potential of the anode and the potential of the reference electrode is consequently determined. In this case, an EL-Cell measurement cell may serve as the reference electrode element for example. The reference electrode element advantageously comprises, for example, a nickel material, a copper material, a nickel-plated copper material or else an aluminum material, or forms at least one layer of said material.

Consequently, it is advantageously possible for individual electrode potentials and consequently as a result also the total cell voltage to be determined and evaluated in a simple and cost-effective manner by means of the present disclosure, wherein initial or beginning lithium platings can be identified at an early stage and as a result consequently can be avoided if desired, in particular when individual anode potentials are known. It should be noted here that lithium plating can occur particularly when the individual anode potential drops below the value "0" (zero). Lithium plating which begins in this way cannot be identified at an early stage when the external cell voltage, which is always given by the difference between the two electrodes, is determined. The reason for this is, in particular, because, when the pure external cell voltage is determined, it is not possible to determine, in principle, whether the potentials of the individual electrodes continue to behave like the initial values or fresh values as reference, or whether the individual potentials or the potentials of the individual electrodes are shifted upward or downward. Consequently, the individual potential of the electrodes or the electrode potential of individual electrodes, such as the anode or the cathode, is advantageously determined by measurement with respect to a suitable reference electrode and, in particular, with reference to a suitable reference electrode element with the present disclosure.

Within the scope of the disclosure, it is furthermore feasible for the cell core to be a winding mandrel or a winding blade or a deformable plastic film winding core. The winding mandrel, which can also be called a rotary pin, advantageously comprises a plastic material and is consequently preferably designed in the form of a plastic rod. The winding mandrel advantageously has a preferably cylindrical shape, and in particular a circular-cylindrical shape, and advantageously a hollow circular-cylindrical shape, wherein the hollow space in the winding mandrel is provided for receiving a winding element of an automatic winding machine which sets the winding mandrel in rotation in order to wind up layers of the winding tape, advantageously comprising the positive and the negative electrode and also the separator which is situated between said electrodes, in particular in a spiraled manner, wherein, after said winding is fixed, for example with a lye-resistant adhesive tape or a metal sleeve, this winding, and in particular this electrode winding, can be inserted into a corresponding housing together with the winding mandrel and the cell core.

In contrast, the winding blade is an advantageously rectangular and, in particular, prismatic component which, comparably to the winding mandrel, serves to wind the layers of a winding tape, advantageously comprising the negative electrode and the positive electrode and also a layer of a separator which is situated between said electrodes, wherein, particularly when a winding blade is used, a prismatic and, in particular, rectangular electrode winding is generated in order to consequently be arranged in a housing in order to form a flat cell.

Furthermore, it is feasible for a deformable plastic film winding core to be used as the cell core, in which plastic film winding core an arrangement of an additional separator layer around the winding core is advantageously avoided, in particular since the plastic film winding core itself can serve to provide DC isolation between the first electrode and the cell core. The plastic film winding core is advantageously a deformable cell core which, after the electrodes and the at least one separator are wound up, can be deformed into any desired design, in order to consequently be used in a flat cell or in an electrochemical energy storage cell which is designed differently from said flat cell, in addition to being used in a round cell.

Furthermore, it is feasible for the reference electrode element to be a housing of the electrochemical energy storage cell, which housing surrounds the electrode winding at least in sections. In this case, it is possible for the housing to be a constituent part of the electrochemical energy storage cell or to merely surround said electrochemical energy storage cell. The housing advantageously comprises a material which conducts electrical energy, such as an aluminum material or a stainless steel material for example. Consequently, if the reference electrode element is the housing of the electrochemical energy storage cell itself or is at least a constituent part of the housing, contact is made with the reference electrode element directly by means of the housing itself, and therefore insertion of a, for example, additional probe or line into the housing and, in particular, into a region of the electrode winding may not be necessary and consequently can be avoided. The reference electrode value which is determined by means of the reference electrode element is accordingly measured directly by means of the housing in a simple and cost-effective manner.

Within the scope of the disclosure, it is furthermore possible for the reference electrode element to be arranged on an inner surface of a housing of an electrochemical energy storage cell, which housing surrounds the electrode winding at least in sections. This arrangement of the separate reference electrode element on the housing, which can be a constituent part of the electrochemical energy storage cell or only surrounds said electrochemical energy storage cell, is particularly advantageous when there is a risk of corrosion of the cell housing, so that inaccurate measurements may occur due to inductive effects and surface reactions of the housing, if the housing itself were the reference electrode element.

It is further feasible for the reference electrode element to be fitted to the inner wall of the housing in the form of a layer, wherein a lithium titanate ($Li_4Ti_5O_{12}$) material or a titanium dioxide material is advantageously suitable for this purpose. Particularly when the reference electrode element is arranged in a bottom region or in a cover region of the housing, on the inner surface of said housing, said reference electrode element is advantageously not damaged even when the previously produced electrode winding is arranged in or inserted into the housing. On account of the housing of the electrochemical energy storage cell making direct contact with the reference electrode element, contact is again advantageously made by means of the housing when the individual electrode potentials are measured, and therefore insertion of an additional probe or else line into the housing and, in particular, into the region of the electrode winding is not necessary.

Within the scope of the disclosure, it is furthermore feasible for the reference electrode element to be arranged on or in a retainer element which surrounds the electrode winding at least in sections, wherein the retainer element makes contact with a housing, which surrounds the retainer element at least in sections and can be a constituent part of the electrochemical energy storage cell or only surrounds said electrochemical energy storage cell as a separate component, at least in sections. The retainer element is advantageously a holder or stabilization element for arranging the electrode winding and, in particular, for fixing the electrode winding and shielding the electrode winding from the housing within the housing. The retainer element may have, for example, a bottom retainer, a top retainer and/or a side retainer or a plurality of side retainers. The retainer element is advantageously produced from a plastic material, such as polypropylene for example, or comprises a plastic material. The reference electrode element is advantageously fitted to a surface, and in particular an inner surface, of one of said retainers and, in particular, the retainer element, or inserted into the retainer element. Insertion of the reference electrode element into the retainer element is to be understood to mean, for example, encapsulation of the reference electrode element when generating the retainer element, for example in the form of the injection-molding process, within the scope of the disclosure. In this case, the reference electrode element is advantageously completely surrounded by the material of the retainer element.

Furthermore, it is feasible for the reference electrode element to be placed or inserted into a cutout in the retainer element and consequently to be surrounded at least only partially or in sections by the material of the retainer element. When the abovementioned injection-molding process is used, in which the reference electrode element is advantageously completely surrounded by the material of the retainer element, it is advantageously possible for contact points of the reference electrode element to extend at least partially out of the material of the retainer element or to protrude out of said material, in order to be able to be tapped-off for contact-making purposes. These contact points advantageously reach out of the outer wall of the retainer element and advantageously make contact with the housing, and in particular an inner wall of the housing, which advantageously surrounds the retainer element at least in regions. Contact is advantageously made with the housing in order to measure the reference electrode potential and, in particular, to determine an individual electrode potential of one of the individual electrodes, wherein contact elements for checking the reference electrode values are fitted, in particular, to an outer wall of the housing, so that insertion of an additional probe or lines etc. into the housing or into the region of the electrode winding are not necessary and advantageously can be avoided.

It is furthermore possible for the reference electrode element to be fitted onto the plastic film winding core which makes contact with a housing of the electrochemical energy storage cell at least in sections, which housing surrounds the electrode winding at least in sections. Within the scope of the disclosure, fitting is to be understood to mean, in particular, pushing, pressing and/or lamination. Accordingly, it is feasible for the reference electrode element to be fitted onto a plastic film winding core onto which a winding, comprising at least the first electrode and the second electrode and a separator film which is arranged between the electrodes, is also wound. The reference electrode element can advantageously be transferred to the housing by means of the housing making contact with the plastic film winding core.

Within the scope of the disclosure, it is furthermore possible for measurement lines and/or communication lines for determining a reference electrode value to be arranged on an outer wall of a housing of the electrochemical energy storage cell, which housing surrounds the electrode winding at least in sections. Within the scope of the disclosure, arrangement is consequently to be understood to mean soldering or welding, wherein, in particular, a wire tape, for example, is soldered or welded to an outer wall of the housing. Measurement values relating to the reference electrode element, which is formed, for example, by the housing itself or is arranged on an inner wall of the housing or is arranged in a region of a retainer element and has contact points which are connected to the housing, can consequently be transmitted by means of this wire tape. It is furthermore feasible for, in particular, a power line to allow communication via corresponding measurement lines, and therefore only one line can consequently be used for transmitting measurement values and for transmitting an electric current.

It is furthermore feasible for the reference electrode element to be insulated from a housing of the electrochemical energy storage cell, which housing surrounds the electrode winding at least in sections, provided that the housing is operatively connected to one of the electrodes. In order to allow the measurement values of the reference electrode element to be checked in this case in particular, it would be feasible to implement line-free signal transmission by radio, wherein, for example, Bluetooth or WLAN can be used.

The disclosure further describes a rechargeable battery, and in particular a rechargeable lithium-ion battery, for supplying electrical energy to an electrical load, having at least one electrochemical energy storage cell. Consequently, the rechargeable battery advantageously has an electrochemical energy storage cell of the abovementioned type. Within the scope of the disclosure, the electrical load is understood to mean, for example, a stationary load, such as a wind power plant for example, or else an electrically driveable vehicle, such as a hybrid vehicle or an electric vehicle, which can be designed in the form of a land vehicle, a watercraft or an aircraft, or else a consumer product, such as a portable mobile telephone or a laptop or tablet for example. A rechargeable battery is, in particular, a rechargeable energy store which has at least one, and advantageously more than one, and in particular a large number of, electrochemical energy storage cells of the abovementioned type, wherein the electrochemical energy storage cell can also be called, in particular, a galvanic cell. The electrochemical energy storage cell is advantageously a galvanic element for spontaneously converting chemical energy into electrical energy. A rechargeable energy store is advantageously to be understood to mean an energy store, and in particular an electrochemical energy store, which can be discharged and charged more than once and advantageously several times.

The described rechargeable battery according to the disclosure provides all of the advantages which have already been described with respect to an electrochemical energy storage cell according to the disclosure in accordance with the preceding aspect of the disclosure.

The disclosure further describes a method for determining an electrode potential of an electrode of an electrochemical energy storage cell, wherein reference electrode values of the reference electrode element, which makes contact with the housing at least in sections or forms at least a portion of the housing, are transmitted to an evaluation unit via measurement lines and/or communication lines which are arranged on a housing of the electrochemical energy storage cell, which housing surrounds the electrode winding at least in sections. Accordingly, it is possible for the electrode potential of at least one of the electrodes, such as the cathode or the anode of an electrochemical energy storage cell for example, to be checked by means of the method according to the disclosure in a simple and cost-effective manner even during operation of the electrochemical energy storage cell and, in particular, during operation of a load which is driven by the electrical energy from the electrochemical energy storage cell. In this respect, contact is made, in particular, with the electrochemical energy storage cell in an outer region of its housing, wherein a reference electrode element is connected to the housing in such a way that lines and, in particular, an additional probe for determining the reference electrode value for determining the potentials of the individual electrodes does not have to be inserted into the interior of the electrochemical energy storage cell and consequently into the interior of the housing of the electrochemical energy storage cell, in particular, into the region of the electrode winding. Instead, contact is advantageously made only with the outer region of the housing by means of a measurement line and/or power line, wherein electrical energy can advantageously be transmitted via a single line which is generated, for example, by the electrochemical energy storage cell, and the reference electrode value can be checked at the same time. The housing of the electrochemical energy storage cell can be a constituent part of said electrochemical energy storage cell or a component of a rechargeable battery, which component can be arranged separately from the electrochemical energy storage cell. It is therefore feasible for the housing to also surround or include more than one electrochemical energy storage cell.

The described method according to the disclosure provides all of the advantages which have already been described with respect to an electrochemical energy storage cell according to the disclosure and/or a rechargeable battery according to the disclosure in accordance with the preceding aspects of the disclosure.

BRIEF DESCRIPTION OF THE DRAWINGS

Embodiments of an electrochemical energy storage cell according to the disclosure of a rechargeable battery according to the disclosure will be explained in greater detail below with reference to drawings, in which, in each case schematically:

FIG. 3 shows a perspective view of a further embodiment of an electrochemical energy storage cell according to the disclosure, FIG. 3A shows a schematic view of the electrochemical energy storage cell of FIG. 3 connected to an evaluation unit via a transmission element, FIG. 4 shows a perspective view of an embodiment of an electrode winding of the embodiment of the electrochemical energy storage cell according to the disclosure shown in FIG. 3.

Elements with the same function and manner of operation are provided with the same reference symbols in each of FIGS. 1 to 8.

DETAILED DESCRIPTION

Figure 1:
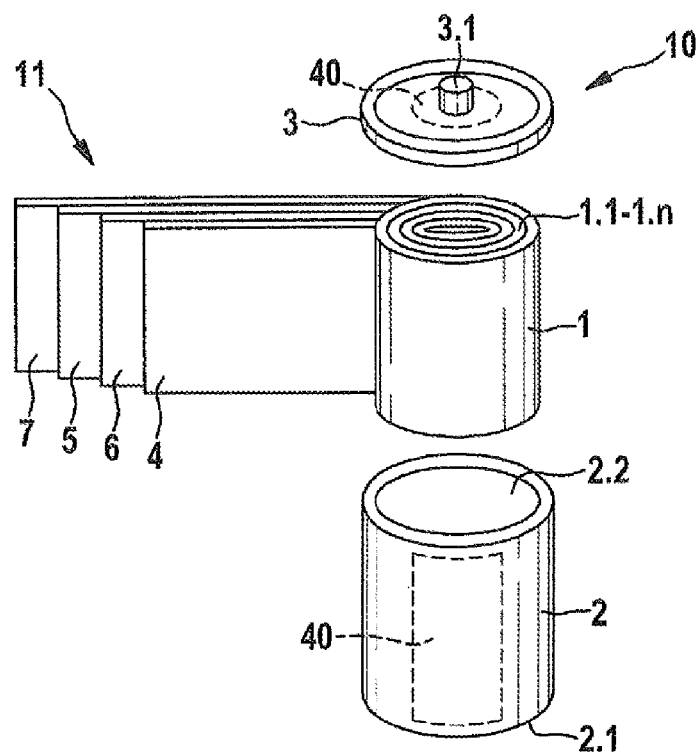
FIG. 1 shows a perspective view of a first embodiment of an electrochemical energy storage cell according to the disclosure.

FIG. 1 schematically shows a perspective view of one embodiment of an electrochemical energy storage cell 10 according to the disclosure. The electrochemical energy storage cell 10, which is in the form of a round cell according to the embodiment of FIG. 1, has an electrode winding 1 which can be arranged in a housing 2. The housing 2 can be covered by means of a cover 3, a transmission element 3.1 being arranged starting from said cover. This transmission element serves, in particular, as a measurement line and/or communication line for determining, for example, a reference electrode value. The housing 2 can itself serve as a reference electrode. However, it is also feasible for an additional electrode and, in particular, a reference electrode element 40 to be arranged within the housing 2 and, in particular, on an inner wall 2.2 of the housing 2. Furthermore, it is feasible for the reference electrode element 40 to also be able to be arranged in a bottom region 2.1 of the housing 2 and/or in a cover 3. The reference electrode element is advantageously arranged on an inner wall of the housing 2 in the bottom region 2.1. The reference electrode element 40 is only schematically illustrated in FIG. 2. The housing 2 can be a constituent part of the electrochemical energy storage cell 10 or else a separate component which surrounds the electrochemical energy storage cell. The electrode winding 1 comprises a winding tape 11 which has at least a first electrode 6 and a second electrode 7 and also a first separator 4 and a second separator 5, and is arranged around a winding core or cell core in the form of a winding in a plurality of layers.

Figure 2:
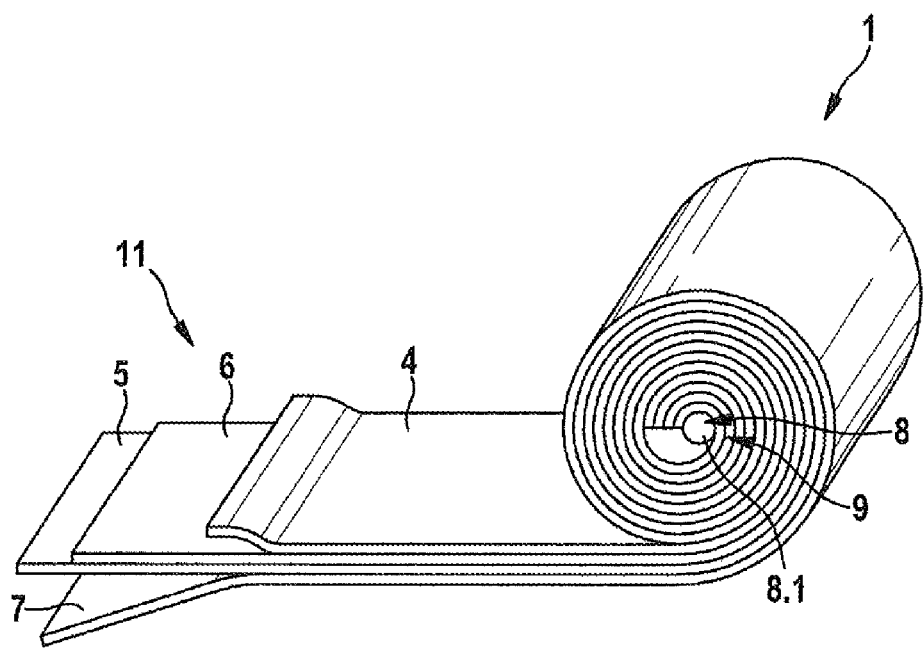
FIG. 2 shows a perspective view of an embodiment of an electrode winding of the embodiment of the electrochemical energy storage cell according to the disclosure shown in FIG. 1.

FIG. 2 schematically shows a perspective view of an embodiment of an electrode winding 1 which is produced by winding up a winding tape, comprising flat electrodes 6 and 7 with separators 4 and 5, around a cell core 8 which is designed in the form of a winding mandrel 9. The cell core 8 or the winding mandrel 9 can additionally have a hollow space 8.1 which advantageously serves for inserting a winding rod of a winding machine in order to set the winding mandrel in rotation in such a way that the winding tape is wound around the cell core 8 in a plurality of layers or winding layers. The embodiment of the electrode winding 1 shown in FIG. 2 advantageously has a round shape, and in particular a cylindrical shape, such as a circular-cylindrical shape for example, and advantageously serves to form a round cell, and in particular a round energy storage cell 10, as shown in FIG. 1 for example.

FIG. 3 schematically shows a perspective view of a further embodiment of an electrochemical energy storage cell 20 according to the disclosure which is designed, in particular, in the form of a flat cell. As also already mentioned above with respect to FIG. 1, the energy storage cell 20 can have a housing 22 or be surrounded by a housing, which housing itself can serve as the reference electrode element 40. However, it is also feasible for a separate electrode and, in particular, a reference electrode or a reference electrode element 40 to be arranged in a region of the housing 22. The reference electrode element 40 is advantageously arranged in the interior of the housing 22 in such a way that said reference electrode element, in the form of a thin film or layer for example, makes contact with the inner wall of the housing 22, so that the reference electrode value of the reference electrode element 40 can be transmitted by means of corresponding transmission elements or transmission lines 3.1 which are connected directly to the outside of the housing 22 to an evaluation unit 25 shown in FIG. 3A. In addition, an electrode winding 21 which advantageously has the design illustrated in FIG. 4, which is described below, is arranged within the housing 22.

FIG. 4 schematically shows a perspective view of a further embodiment of an electrode winding 21, and in particular the embodiment of an electrode winding 21 of an electrochemical energy storage cell 20 according to the disclosure illustrated in FIG. 3. The electrode winding 21 advantageously comprises a plurality of layers of a winding of a winding tape 11, comprising at least a first separator 4 and a second separator 5 and also a first electrode 6, and in particular a cathode, and also a second electrode 7, and in particular an anode. The separators 4 and 5 advantageously serve to DC isolate the cathode 6 and the anode 7 from one another in this case. At least the first separator 4 is advantageously arranged around the cell core 8, which is in the form of a winding blade 23 in particular, in order to prevent the first electrode 6, and in particular the cathode, making contact with the cell core 8 and the winding blade 23. The second separator 5 is advantageously arranged between the first electrode 6 and the second electrode 7. The embodiment of the electrode winding 21 shown in FIG. 4 is advantageously designed in a rectangular or prismatic form in order to be able to be arranged as an electrode winding within a flat cell, as shown in FIG. 3 for example.

Figure 5:
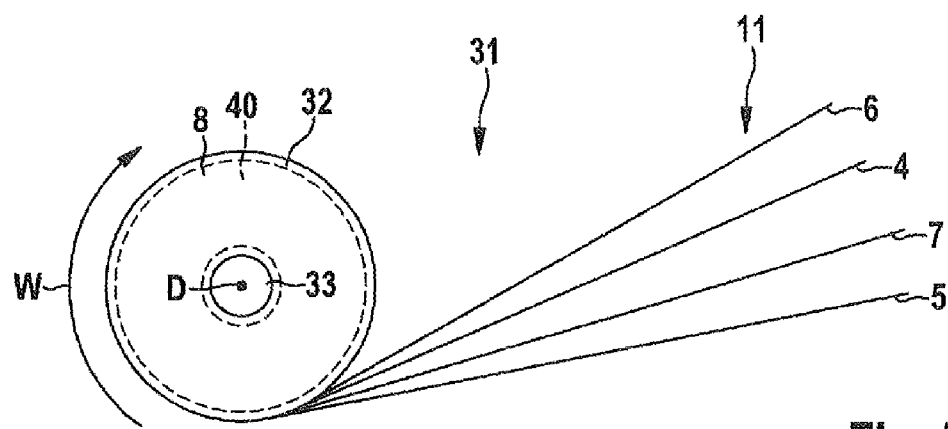
FIG. 5 shows a basic diagram of an embodiment of an electrode winding having a plastic film winding core of an electromagnetic energy storage cell according to the disclosure during winding.

FIG. 5 schematically shows a basic diagram of an embodiment of a further electrode winding 31 which has a plastic film winding core 32 as the cell core 8. At least one winding layer of a winding tape, comprising a first separator 4 and/or a second separator 5 and also a first electrode 6, and in particular a cathode, and also a second electrode 7, and in particular an anode, is arranged around the plastic film winding core 32. One advantage over the use of a winding mandrel or winding blade as shown in FIGS. 2 and 4 is that a first layer of a separator does not have to be arranged around the plastic film winding core 32 itself in order to space apart or DC isolate an electrode 6 or 7, and in particular the first electrode 6, and the plastic film winding core 32 from one another. Furthermore, it is feasible for the plastic film winding core 32 to also have a hollow space 33 into which, for example, a winding rod of a winding machine can be inserted in order to cause the plastic film winding core 32 to rotate about its rotation axis D in winding direction W, as a result of which the winding tape 11 is wound around the plastic film winding core 32. After the winding tape 11 is wound up around the plastic film winding core 32, this electrode winding 31 can be deformed into any configuration. This is shown in FIG. 6 in particular.

As shown in FIG. 5, a reference electrode element 40 can be fitted and, in particular, pushed, pressed or laminated, onto the plastic film winding core 32 in such a way that the additional arrangement of a reference electrode element 40 in a region of a housing which surrounds the electrochemical energy storage cell at least in sections is no longer required. In this case, the plastic film winding core 32 which has the reference electrode element 40 advantageously makes contact with a wall of the housing at least in regions, as a result of which data relating to the reference electrode element can once again be transmitted to a transmission element, and in particular transmission lines, such as measurement lines and/or power lines.

Figure 6:
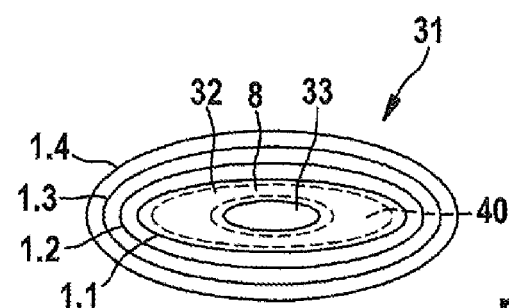
FIG. 6 shows a basic diagram of the embodiment of the electrode winding shown in FIG. 5 after a deformation process.

FIG. 6 schematically shows a basic diagram of a deformed electrode winding 31, and in particular the electrode winding 31 shown in FIG. 5 after it has been deformed. Consequently, the deformed electrode winding 31 exhibits a plurality of winding layers 1.1 to 1.4 of the winding tape 11 which has been wound around the plastic film winding core 32. An electrode winding 31 having a plastic film winding core 32 can advantageously be used to produce any desired shape of an electrode winding for arrangement within a housing for generating an electrochemical energy storage cell.

Figure 7:
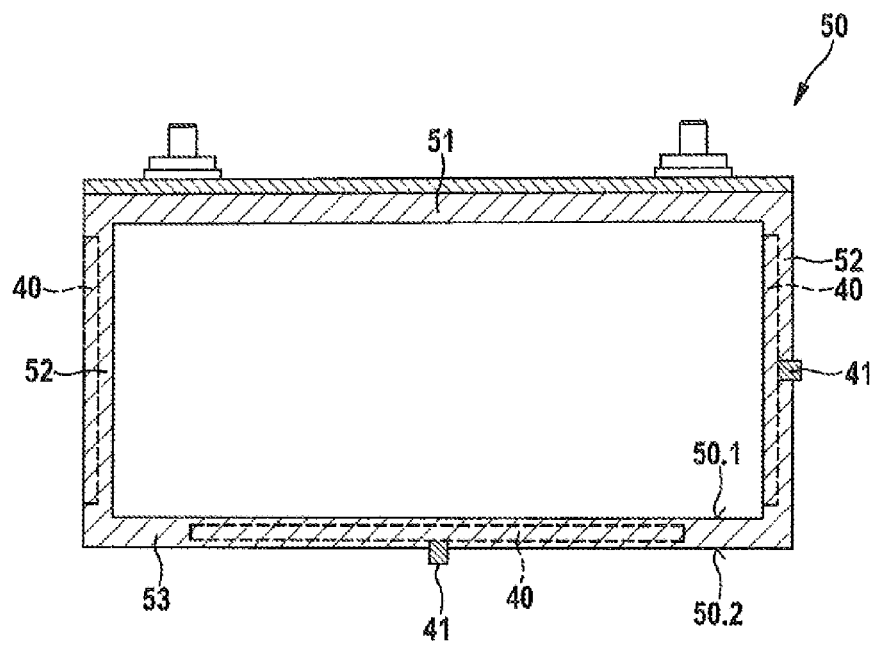
FIG. 7 shows a side view of an embodiment of a retainer element of an electrochemical energy storage cell according to the disclosure.

FIG. 7 schematically shows a side view and, in particular, a lateral sectional illustration through a retainer element 50 of the electrochemical energy storage cell. The retainer element 50 advantageously has a top retainer 51, at least one side retainer 52 and a bottom retainer 53, which retainers are connected to one another in such a way that they form an advantageously closed retainer element 50. In this case, the reference electrode element 40 can be arranged, for example, in the retainer element 50 and advantageously in a bottom retainer 53 of the retainer element 50 in such a way that the material of the retainer element 50 completely surrounds this reference electrode element 40, wherein contact points 41 project from the reference electrode element 40 in the direction of an outer face 50.2 of the retainer element 50, in order to make contact with a housing, not shown here, and, in particular, an inner wall of a housing, not shown here. A connection between the housing and the reference electrode element 50 can advantageously be established by a contact-making connection of this kind.

It is accordingly also possible for the reference electrode element 40 to be arranged, for example, on an inner wall 50.1 of the retainer element 50, as shown in the case of the right hand-side side retainer 52 in FIG. 7. In this case, it is necessary to arrange additional contact points 41, starting from the reference electrode element 40, through the material wall of the retainer element 50, as far as a housing, not shown here, in order to allow the reference electrode element 40 to make contact with an inner wall of the housing.

Consequently, it is also possible for the reference electrode element 40 to be arranged in an outer region or on an outer wall of 50.2 of the retainer element 50 in such a way that the reference electrode element 40 is surrounded only partially by the material of the retainer element 50, and a direct contact-making connection is made possible between the reference electrode element 40 and the housing. This is indicated in FIG. 7, for example, with the arrangement of the reference electrode element 40 on the left hand-side side retainer 52. Additional contact points 41 are advantageously not required in this case.

Figure 8:
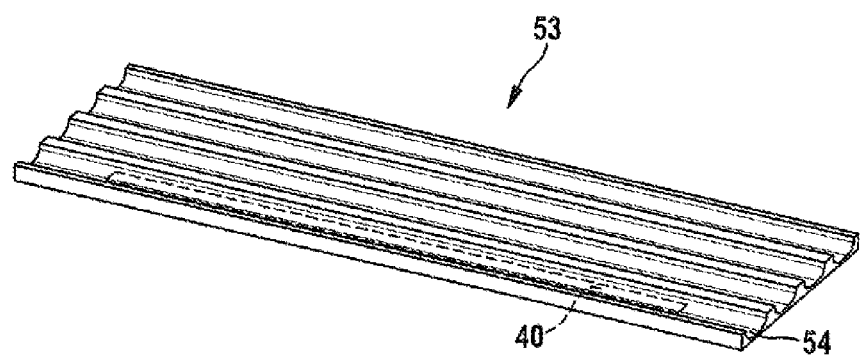
FIG. 8 shows a perspective view of an embodiment of a bottom retainer of a retainer element of an electrochemical energy storage cell according to the disclosure.

FIG. 8 schematically shows a perspective view of a bottom retainer 53 which advantageously has a plurality of recesses 54 or curved portions 54 within which, for example, a reference electrode element 40 can be arranged. Depending on whether direct contact with the reference electrode element 40 by a housing, not shown here, of an electrochemical energy storage cell, not shown here, is made possible, further contact points may or may not be required in order to establish a contact-making connection between the reference electrode element 40 and the housing of the electrochemical energy storage cell.

What is claimed is:

1. An electrochemical energy storage cell configured to repeatedly store electrical energy, comprising:
    a cell core;
    an electrode winding that is disposed around the cell core, and that includes:
        at least two electrodes; and
        at least one separator positioned between the at least two electrodes;
    a reference electrode element that enables determining an electrode potential of at least one of the at least two electrodes;
    a retainer element that surrounds the electrode winding, at least in sections; and
    a housing which surrounds the retainer element, at least in sections;
    wherein:
        the reference electrode element is arranged on or in the retainer element; and
        the retainer element is in contact with the housing, at least in sections.

2. The electrochemical energy storage cell according to claim 1, wherein the cell core is defined by at least one of (i) a winding mandrel, (ii) a winding blade, and (iii) a deformable plastic film winding core.

3. The electrochemical energy storage cell according to claim 1, wherein:
    the cell core is defined by a deformable plastic film winding core which is in contact with the housing, at least in sections.

4. The electrochemical energy storage cell according to claim 1, further comprising:
    at least one of (i) measurement lines, and (ii) communication lines that enable determining a reference electrode value, and that are arranged on an outer wall of the housing.

5. The electrochemical energy storage cell according to claim 1, wherein:
    the housing is operatively connected to one of the at least two electrodes; and
    the reference electrode element is insulated from the housing.

6. A rechargeable battery that is configured to supply electrical energy to an electrical load, the rechargeable battery comprising:
    at least one electrochemical energy storage cell that includes:
    a cell core;
    an electrode winding that is disposed around the cell core, and that includes:
        at least two electrodes; and
        at least one separator positioned between the at least two electrodes;
    a reference electrode element that enables determining an electrode potential of at least one of the at least two electrodes;
    a retainer element that surrounds the electrode winding, at least in sections; and
    a housing which surrounds the retainer element, at least in sections;
    wherein:
        the reference electrode element is arranged on or in the retainer element; and
        the retainer element is in contact with the housing, at least in sections.

* * * * *